US011407890B2

(12) United States Patent
Grover et al.

(10) Patent No.: US 11,407,890 B2
(45) Date of Patent: Aug. 9, 2022

(54) DUAL CURE ADDITIVE MANUFACTURING RESINS FOR PRODUCTION OF FLAME RETARDANT OBJECTS

(71) Applicant: Carbon, Inc., Redwood City, CA (US)

(72) Inventors: Ikpreet Singh Grover, Redwood City, CA (US); Matthew S. Menyo, San Francisco, CA (US)

(73) Assignee: Carbon, Inc., Redwood City, CA (US)

( * ) Notice: Subject to any disclaimer, the term of this patent is extended or adjusted under 35 U.S.C. 154(b) by 0 days.

(21) Appl. No.: 17/271,360

(22) PCT Filed: Sep. 6, 2019

(86) PCT No.: PCT/US2019/049913
§ 371 (c)(1),
(2) Date: Feb. 25, 2021

(87) PCT Pub. No.: WO2020/055682
PCT Pub. Date: Mar. 19, 2020

(65) Prior Publication Data
US 2021/0246298 A1 Aug. 12, 2021

Related U.S. Application Data (60) Provisional application No. 62/729,118, filed on Sep. 10, 2018.

(51) Int. Cl.
| | |
|---|---|
| *B33Y 10/00* | (2015.01) |
| *C08L 51/00* | (2006.01) |
| *B33Y 70/00* | (2020.01) |
| *B29C 64/124* | (2017.01) |
| *B29C 64/35* | (2017.01) |
| *B33Y 40/20* | (2020.01) |
| *B29K 63/00* | (2006.01) |
| *B29K 105/00* | (2006.01) |

(52) U.S. Cl.
CPC .......... *C08L 51/003* (2013.01); *B29C 64/124* (2017.08); *B29C 64/35* (2017.08); *B33Y 10/00* (2014.12); *B33Y 40/20* (2020.01); *B33Y 70/00* (2014.12); *B29K 2049/00* (2013.01); *B29K 2063/00* (2013.01); *B29K 2105/0002* (2013.01); *B29K 2105/0026* (2013.01)

(58) Field of Classification Search
CPC .............................. C08L 51/003; B33Y 10/00
See application file for complete search history.

(56) References Cited

U.S. PATENT DOCUMENTS

| | | | |
|---|---|---|---|
| 3,051,671 A | 8/1962 | Cummings | |
| 3,213,058 A | 10/1965 | Boyle et al. | |
| 3,386,955 A | 6/1968 | Chrobok et al. | |
| 3,477,990 A | 11/1969 | Dante et al. | |
| 3,945,972 A | 3/1976 | Sakamoto | |
| 3,947,395 A | 3/1976 | Ogata et al. | |
| 4,283,520 A | 8/1981 | Moser et al. | |
| 4,352,918 A | 10/1982 | Whiteside et al. | |
| 4,371,689 A | 2/1983 | Gaku et al. | |
| 4,529,821 A | 7/1985 | Stockinger et al. | |
| 4,550,203 A | 10/1985 | Stockinger et al. | |
| 4,594,219 A | 6/1986 | Hostatter et al. | |
| 4,618,712 A | 10/1986 | Stockinger et al. | |
| 4,694,096 A | 9/1987 | Lehmann et al. | |
| 4,767,832 A | 8/1988 | Marx | |
| 4,785,075 A | 11/1988 | Shimp | |
| 4,833,226 A | 5/1989 | Ishimura et al. | |
| 4,859,761 A | 8/1989 | Flury et al. | |
| 5,236,637 A | 8/1993 | Hull | |
| 5,319,004 A | 6/1994 | Marten et al. | |
| 5,391,072 A | 2/1995 | Lawton et al. | |
| 5,529,473 A | 6/1996 | Lawton et al. | |
| 5,599,856 A | 2/1997 | Gardner | |
| 5,912,308 A | 6/1999 | Das et al. | |
| 5,973,082 A | 10/1999 | Elmore | |
| 6,355,763 B1 | 3/2002 | Scherzer et al. | |
| 6,656,979 B1 | 12/2003 | Kitano et al. | |
| 6,861,475 B2 | 3/2005 | Ilenda et al. | |
| 6,881,813 B2 | 4/2005 | Hoefer et al. | |
| 6,916,867 B2 | 7/2005 | Gugumus | |
| 7,157,586 B2 | 1/2007 | Wood et al. | |
| 7,438,846 B2 | 10/2008 | John | |
| 7,625,977 B2 | 12/2009 | Lutz et al. | |
| 7,642,316 B2 | 1/2010 | Rego et al. | |

(Continued)

FOREIGN PATENT DOCUMENTS

| | | | |
|---|---|---|---|
| WO | 2015164234 A1 | 10/2015 | |
| WO | 2016133759 A1 | 8/2016 | |

(Continued)

OTHER PUBLICATIONS

Griffini, G., Invernizzi, M., Levi, M., Natale, G., Postiglione, G. and Turri, S., 2016. 3D-printable CFR polymer composites with dual-cure sequential IPNs. Polymer, 91, pp. 174-179. (Year: 2016).*
Spec sheet for Sb2O3 @ 250nm and 5micron https://www.sigmaaldrich.com/specification-sheets/340/042/230898-BULK_ALDRICH_.pdf
https://www.sigmaaldrich.com/specification-sheets/153/467/637173-BULK_ALDRICH_.pdf (Year: 2021).*
International Search Report and Written Opinion corresponding to PCT/US2019/049913; dated Dec. 10, 2019 (15 pages).
Janusziewicz, Rima , et al., "Layerless fabrication with continuous liquid interface production", PNAS, 113, 2016, 11703-11708.
Siemmelen, Mylene , et al., "A Fully Biobased Epoxy Resin from Vegetable Oils: From the Synthesis of the Precursors by Thiol-ene Reaction to the Study of the Final Material", Journal of Polymer Science Part A: Polymer Chemistry, Wiley, 49 (11), 2011, 2434-2444.

(Continued)

*Primary Examiner* — Nicholas R Krasnow
(74) *Attorney, Agent, or Firm* — Myers Bigel, P.A.

(57) ABSTRACT

The present invention concerns methods of forming a three-dimensional object, and polymerizable liquids such as dual cure resins useful for making a three-dimensional object by stereolithography, such as by continuous liquid interface production (CLIP), wherein the three-dimensional object is flame retardant.

32 Claims, 1 Drawing Sheet

(56) References Cited

U.S. PATENT DOCUMENTS

| | | | |
|---|---|---|---|
| 7,695,643 B2 | 4/2010 | Fritzsche et al. | |
| 7,892,474 B2 | 2/2011 | Shkolnik et al. | |
| 8,088,245 B2 | 1/2012 | Lutz et al. | |
| 8,110,135 B2 | 2/2012 | El-Siblani | |
| 8,383,025 B2 | 2/2013 | Li et al. | |
| 8,481,622 B2 | 7/2013 | Flanigan et al. | |
| 8,632,654 B2 | 1/2014 | Walter et al. | |
| 8,779,036 B2 | 7/2014 | Spyrou et al. | |
| 8,991,321 B2 | 3/2015 | Bar-Yaakov et al. | |
| 9,133,301 B2 | 9/2015 | Gan et al. | |
| 9,169,386 B2 | 10/2015 | Katzakian et al. | |
| 9,193,858 B2 | 11/2015 | Su et al. | |
| 9,205,601 B2 | 12/2015 | DeSimone et al. | |
| 9,211,678 B2 | 12/2015 | DeSimone et al. | |
| 9,216,546 B2 | 12/2015 | DeSimone et al. | |
| 9,315,698 B2 | 4/2016 | Zaffaroni et al. | |
| 9,453,142 B2 | 9/2016 | Rolland et al. | |
| 9,598,606 B2 | 3/2017 | Rolland et al. | |
| 9,676,963 B2 | 6/2017 | Rolland et al. | |
| 9,782,947 B2 | 10/2017 | Gunzel et al. | |
| 10,100,190 B2 | 10/2018 | Shimozawa et al. | |
| 10,227,482 B2 | 3/2019 | Arechederra | |
| 11,090,859 B2* | 8/2021 | Menyo | C08G 73/0661 |
| 2003/0198824 A1* | 10/2003 | Fong | B33Y 70/00 |
| | | | 428/515 |
| 2008/0171800 A1 | 7/2008 | Dietz et al. | |
| 2009/0306258 A1 | 12/2009 | Siripurapu et al. | |
| 2010/0025084 A1 | 2/2010 | Ezaki et al. | |
| 2012/0295077 A1* | 11/2012 | Ficek | B33Y 70/00 |
| | | | 428/195.1 |
| 2013/0032375 A1 | 2/2013 | Georlette et al. | |
| 2013/0292862 A1 | 11/2013 | Joyce | |
| 2013/0295212 A1 | 11/2013 | Chen et al. | |
| 2015/0184039 A1 | 7/2015 | Lutz et al. | |
| 2015/0240113 A1 | 8/2015 | Pratt et al. | |
| 2015/0331402 A1 | 11/2015 | Lin et al. | |
| 2015/0360419 A1 | 12/2015 | Willis et al. | |
| 2016/0016077 A1 | 1/2016 | Yokota et al. | |
| 2016/0136889 A1 | 5/2016 | Rolland et al. | |
| 2016/0137838 A1 | 5/2016 | Rolland et al. | |
| 2016/0177078 A1* | 6/2016 | Naito | C08L 67/04 |
| | | | 264/109 |
| 2016/0288376 A1 | 10/2016 | Sun et al. | |
| 2017/0129167 A1 | 5/2017 | Castanon | |
| 2017/0129169 A1 | 5/2017 | Batchelder et al. | |
| 2017/0239887 A1 | 8/2017 | Rolland et al. | |
| 2018/0126630 A1 | 5/2018 | Panzer et al. | |
| 2018/0243976 A1 | 8/2018 | Feller | |
| 2018/0290374 A1 | 10/2018 | Willis et al. | |

FOREIGN PATENT DOCUMENTS

| | | |
|---|---|---|
| WO | 2016145182 A1 | 9/2016 |
| WO | 2017040883 A1 | 3/2017 |
| WO | 2017044381 A1 | 3/2017 |

OTHER PUBLICATIONS

Tumbleston, John R., et al., "Continuous liquid interface production of 3D Objects", Science, 347(6228), 2015, 1349-1352.

* cited by examiner

DUAL CURE ADDITIVE MANUFACTURING RESINS FOR PRODUCTION OF FLAME RETARDANT OBJECTS

CROSS REFERENCE TO RELATED APPLICATIONS

This application is a 35 U.S.C. § 371 national phase application of International Application Serial No. PCT/US2019/049913, filed Sep. 6, 2019, which claims priority to U.S. Provisional Application Ser. No. 62/729,118, filed Sep. 10, 2018, the entire contents of which are hereby incorporated by reference.

FIELD OF THE INVENTION

The present invention concerns polymerizable liquids, polymer compositions formed therefrom, and methods of making such polymer compositions, preferably in the form of shaped three-dimensional objects by additive manufacturing techniques such as continuous liquid interface production.

BACKGROUND OF THE INVENTION

In conventional additive or three-dimensional fabrication techniques, construction of a three-dimensional object is performed in a step-wise or layer-by-layer manner. Typically, layer formation is performed through solidification of photo curable resin under the action of visible or UV light irradiation. Generally referred to as "stereolithography," two particular techniques are known: one in which new layers are formed at the top surface of the growing object; the other in which new layers are formed at the bottom surface of the growing object. Examples of such methods include those given in U.S. Pat. No. 5,236,637 to Hull (see, e.g., FIGS. 3-4), U.S. Pat. Nos. 5,391,072 and 5,529,473 to Lawton, U.S. Pat. No. 7,438,846 to John, U.S. Pat. No. 7,892,474 to Shkolnik, U.S. Pat. No. 8,110,135 to El-Siblani, U.S. Patent Application Publication No. 2013/0292862 to Joyce, and US Patent Application Publication No. 2013/0295212 to Chen et al.

Recently, techniques referred to as "continuous liquid interface production" (or "CLIP") have been developed. These techniques enable the rapid production of three-dimensional objects in a layerless manner, by which the parts may have desirable structural and mechanical properties. See, e.g., J. DeSimone et al., U.S. Pat. Nos. 9,211,678, 9,205,601, 9,216,546, J. Tumbleston, et al., *Continuous liquid interface production of 3D Objects, Science* 347, 1349-1352 (2015), and R. Janusziewcz at al., Layerless fabrication with continuous liquid interface production, *Proc. Natl. Acad. Sci. USA* 113, 11703-11708 (2016).

More recently, dual cure stereolithography resins suitable for stereolithography techniques (particularly for CLIP) are described in J. Rolland et al., U.S. Pat. No. 9,453,142, and US Patent Application Publication Nos. US 2016/0136889, US 2016/0137838 and US 2016/016077. These resins usually include a first polymerizable system typically polymerized by light (sometimes referred to as "Part A") from which an intermediate object is produced, and also include at least a second polymerizable system ("Part B") which is usually cured after the intermediate object is first formed, and which impart desirable structural and/or tensile properties to the final object.

These two developments have spurred the application of additive manufacturing processes beyond the manufacture of (primarily) prototype objects, to functional objects more suited to a variety of end uses.

SUMMARY OF THE INVENTION

Provided herein according to some embodiments is a method of forming a three-dimensional object, comprising: (a) providing a polymerizable liquid comprising a mixture of (i) a light polymerizable first component, (ii) a second solidifiable component that is different from said first component, wherein said second solidifiable component comprises flame retardant groups (e.g., halogen groups such as bromine, e.g., in an amount of from 1, 2, or 5% to 15 or 20% by weight of the polymerizable liquid), and (iii) optionally, a flame retardant synergist (e.g., an antimony or aromatic amine synergist, e.g., in an amount of from 0.1, 0.5 or 1% to 3, 4, or 5% by weight of the polymerizable liquid); (b) producing a three-dimensional intermediate from said polymerizable liquid by an additive manufacturing process including irradiating said polymerizable liquid with light to form a solid polymer scaffold from said first component and containing said second solidifiable component carried in said scaffold in unsolidified and/or uncured form, said intermediate having the same shape as, or a shape to be imparted to, said three-dimensional object; optionally wherein said polymerizable liquid further comprises an organic diluent and wherein said irradiating is performed under conditions in which said organic diluent chemically reacts (e.g., degrades, isomerizes, cross-reacts, or polymerizes (e.g., with a light polymerizable component), etc.) by an amount sufficient to increase the strength of said intermediate; (c) optionally washing said intermediate, and (d) concurrently with or subsequent to said producing step (b), further curing said second solidifiable component in said three-dimensional intermediate to form said three-dimensional object.

In some embodiments, the polymerizable liquid comprises a toughener (e.g., a core-shell rubber, a thermoplastic toughener, etc., including combinations thereof), preferably in an amount of from about 5 or 10 to 20, 25 or 30 percent by weight, and optionally wherein the toughener has a phenol, amine, epoxide, or isocyante reactive end group that is reactive with epoxides.

In some embodiments, the producing step (b) is carried out by stereolithography (e.g., bottom-up stereolithography such as continuous liquid interface production).

In some embodiments, the producing step (b) is carried out by: (i) providing a carrier and an optically transparent member having a build surface, said carrier and said build surface defining a build region therebetween; (ii) filling said build region with said polymerizable liquid, and (iii) irradiating said build region with light through said optically transparent member to form said solid polymer scaffold from said first component and also advancing said carrier and said build surface away from one another to form said three-dimensional intermediate.

In some embodiments, the further curing step (d) is carried out subsequent to said producing step (b), and optionally but preferably subsequent to said washing step (c).

In some embodiments, the further curing step (d) is carried out by heating, microwave irradiating, or both heating and microwave irradiating.

In some embodiments, the polymerizable liquid comprises: (a) light-polymerizable monomers and/or prepolymers that can participate in forming an intermediate object by stereolithography (preferably included in an amount of from 5, 10, or 20 percent by weight to 50, 60, or 80 percent by weight); and (b) heat-polymerizable monomers and/or prepolymers (preferably included in an amount of from 5, 10 or 20 percent by weight to 40, 50 or 60 percent by weight); optionally, but in some embodiments preferably, wherein the light polymerizable monomers and/or prepolymers comprise reactive end groups selected from the group consisting of acrylates, methacrylates, α-olefins, N-vinyls, acrylamides, methacrylamides, styrenics, epoxides, thiols, 1,3-dienes, vinyl halides, acrylonitriles, vinyl esters, maleimides, and vinyl ethers; and/or optionally, but in some embodiments preferably, wherein the heat polymerizable monomers and/or prepolymers comprise reactive end groups selected from the group consisting of: epoxy/amine, epoxy/hydroxyl, oxetane/amine, oxetane/alcohol, isocyanate/hydroxyl, isocyanate/amine, isocyanate/carboxylic acid, cyanate ester, anhydride/amine, amine/carboxylic acid, amine/ester, hydroxyl/carboxylic acid, hydroxyl/acid chloride, amine/acid chloride, vinyl/Si—H, Si—Cl/hydroxyl, Si—Cl/amine, hydroxyl/aldehyde, amine/aldehyde, hydroxymethyl or alkoxymethyl amide/alcohol, aminoplast, alkyne/azide, click chemistry reactive groups, alkene/sulfur, alkene/thiol, alkyne/thiol, hydroxyl/halide, isocyanate/water, Si—OH/hydroxyl, Si—OH/water, Si—OH/Si—H, Si—OH/Si—OH, perfluorovinyl, diene/dienophiles, olefin metathesis polymerization groups, olefin polymerization groups for Ziegler-Natta catalysis, and ring-opening polymerization groups and mixtures thereof.

In some embodiments, the polymerizable liquid further comprises a hardener (e.g., included in an amount of at least 1, 5, or 10 percent by weight, up to 40 or 50 percent by weight) (e.g., the hardener comprising a compound having amine, thiol, vinyl ether, maleimide, or allyl reactive end groups).

In some embodiments, the polymerizable liquid further comprises at least one photoinitiator (e.g., in an amount of from 0.1 to 1 or 5 percent by weight), optionally at least one dye (e.g., in an amount of 0.001 or 0.01 to 1 or 5 percent by weight), and optionally at least one filler (e.g., in an amount of 0.01 or 0.1 to 20 or 50 percent by weight).

In some embodiments, the second solidifiable component comprises an epoxy or cyanate ester resin, preferably in an amount from 20 or 30 percent by weight to 50, 60 or 70 percent by weight.

In some embodiments, the second solidifiable component comprises an epoxy (e.g., a brominated epoxy), optionally in combination with a cyanate ester resin.

In some embodiments, the organic diluent comprises N,N'-dimethylacrylamide, n-vinyl-2-pyrrolidone, n-vinyl formamide, n-vinyl caprolactam, acryloylmorpholine, or a combination of two or more thereof.

In some embodiments, the polymerizable liquid comprises a hardener (e.g., an amine hardener such as a diaminodiphenyl sulfone hardener), optionally, but preferably, with said organic diluent included in an amount sufficient to dissolve said hardener in said polymerizable liquid.

In some embodiments, the polymerizable liquid comprises a chain extender (e.g., a dihydric phenolic compound) (e.g., in an amount of from 5 or 10 to 20, 25 or 30 percent by weight), and optionally further comprises a chain extender catalyst (e.g., an onium salt such as a phosphonium salt) (e.g., in an amount of from 0.01, 0.05 or 0.1 to 2, 5 or 10 percent by weight).

In some embodiments, the flame retardant synergist is present and comprises an antimony synergist (e.g., antimony pentoxide such as antimony pentoxide functionalized with ethoxylated amine).

In some embodiments, the three-dimensional object is rigid.

Also provided herein is a polymer blend comprising a light polymerized first component and a heat polymerized second component, wherein samples of the polymer blend configured for testing according to UL 94 and having a thickness of 2 millimeters achieve a UL 94 V-0, V-1, or V-2 rating (e.g., achieves a UL 94 V-0 rating).

In some embodiments, the polymer blend has a notched Izod Impact Strength of at least 30, 40, or 50 J/m when measured in accordance with ASTM D256, and/or a heat deflection temperature of at least 80, 90, or 100 degrees Centigrade when measured in accordance with ASTM D648.

In some embodiments, the polymer blend comprises a toughener (e.g., a core-shell rubber, a thermoplastic toughener, etc.), preferably in an amount of from about 5 or 10 percent by weight to 20, 25 or 30 percent by weight.

In some embodiments, the heat polymerized second component comprises an epoxy or cyanate ester polymer, preferably in an amount from 20 or 30 percent by weight to 50, 60 or 70 percent by weight.

In some embodiments, the heat polymerized second component comprises an epoxy polymer (e.g., a brominated epoxy polymer), optionally in combination with a cyanate ester polymer.

In some embodiments, the polymer blend is configured as a three-dimensional object, said object produced by the process of additive manufacturing (e.g., stereolithography, such as continuous liquid interface production).

Further provided herein is a dual cure resin useful for making a three-dimensional object by stereolithography, comprising: (a) light-polymerizable monomers and/or prepolymers that can participate in forming an intermediate object by stereolithography such as CLIP (e.g., included in an amount of from 1, 5, or 10 percent by weight, to 50, 60, or 80 percent by weight); (b) heat-polymerizable monomers and/or prepolymers (e.g., included in an amount of from 5 or 10 percent by weight to 50 or 60 percent by weight); (c) a hardener (e.g., a compound having amine, thiol, vinyl ether, maleimide, or allyl reactive end groups) (e.g., included in an amount of at least 1, 5, or 10 percent by weight, up to 40 or 50 percent by weight), or a chain extender (e.g., a dihydric phenolic compound) (e.g., in an amount of from 5 or 10 to 20, 25 or 30 percent by weight) (and optionally further comprising a chain extender catalyst (e.g., an onium salt such as a phosphonium salt) (e.g., in an amount of from 0.01, 0.05 or 0.1 to 2, 5 or 10 percent by weight)); (d) optionally, a flame retardant synergist (e.g., an antimony or aromatic amine synergist, e.g., in an amount of from 0.1, 0.5 or 1% to 3, 4, or 5% by weight of the polymerizable liquid); and (e) optionally, an organic diluent in a viscosity-reducing effective amount, optionally, but preferably, wherein said diluent solubilizes or dissolves said hardener in said resin, wherein one or both of said: (a) heat-polymerizable monomers and/or prepolymers, and said (c) hardener or chain extender, comprises flame retardant groups (e.g., halogen groups such as bromine, e.g., in an amount of from 1, 2, or 5% to 15 or 20% by weight of the resin).

In some embodiments, the resin may further include: (f) a toughener (e.g., a core-shell rubber, a thermoplastic toughener, etc., including combinations thereof), preferably in an amount of from about 5 or 10 to 20, 25 or 30 percent by weight, optionally wherein the toughener has a phenol, amine, epoxide, or isocyante reactive end group that is reactive with epoxides.

In some embodiments, the hardener comprises a polyamine (e.g., a diamine hardener such as a diaminodiphenyl sulfone hardener), optionally, but preferably, with said organic diluent included in an amount sufficient to dissolve said hardener in said resin.

In some embodiments, the resin comprises both of said hardener and said chain extender.

In some embodiments, the diluent comprises N,N'-dimethylacrylamide, n-vinyl-2-pyrrolidone, n-vinyl formamide, n-vinyl caprolactam, acryloylmorpholine, or a mixture of two or more thereof.

In some embodiments, the light polymerizable monomers and/or prepolymers comprise reactive end groups selected from the group consisting of acrylates, methacrylates, α-olefins, N-vinyls, acrylamides, methacrylamides, styrenics, epoxides, thiols, 1,3-dienes, vinyl halides, acrylonitriles, vinyl esters, maleimides, and vinyl ethers.

In some embodiments, the heat polymerizable monomers and/or prepolymers comprise reactive end groups selected from the group consisting of: epoxy/amine, epoxy/hydroxyl, oxetane/amine, oxetane/alcohol, isocyanate/hydroxyl, isocyanate/amine, isocyanate/carboxylic acid, cyanate ester, anhydride/amine, amine/carboxylic acid, amine/ester, hydroxyl/carboxylic acid, hydroxyl/acid chloride, amine/acid chloride, vinyl/Si—H, Si—Cl/hydroxyl, Si—Cl/amine, hydroxyl/aldehyde, amine/aldehyde, hydroxymethyl or alkoxymethyl amide/alcohol, aminoplast, alkyne/azide, click chemistry reactive groups, alkene/sulfur, alkene/thiol, alkyne/thiol, hydroxyl/halide, isocyanate/water, Si—OH/hydroxyl, Si—OH/water, Si—OH/Si—H, Si—OH/Si—OH, perfluorovinyl, diene/dienophiles, olefin metathesis polymerization groups, olefin polymerization groups for Ziegler-Natta catalysis, and ring-opening polymerization groups and mixtures thereof.

In some embodiments, the resin further comprises at least one photoinitiator (e.g., in an amount of from 0.1 to 1 or 5 percent by weight), optionally at least one dye (e.g., in an amount of 0.001 or 0.01 to 1 or 5 percent by weight), and optionally at least one filler (e.g., in an amount of 0.01 or 0.1 to 20 or 50 percent by weight).

In some embodiments, the resin comprises a cyanate ester or epoxy resin.

In some embodiments, the resin comprises an epoxy (e.g., a brominated epoxy), optionally in combination with a cyanate ester resin.

Still further provided herein is a method of making a three-dimensional object, comprising: (a) providing a dual cure resin as taught herein; (b) producing by additive manufacturing a three-dimensional intermediate from said dual cure resin, said intermediate having the same shape as, or a shape to be imparted to, said three-dimensional object, said additive manufacturing including irradiating the resin with light; (c) optionally washing said intermediate; and then (d) heating said intermediate (i.e., to a temperature at which said heat-polymerizable monomers and/or prepolymers polymerize) to produce said three-dimensional object.

In some embodiments, the irradiating is carried out under conditions in which said organic diluent chemically reacts (e.g., degrades, isomerizes, cross-reacts, and/or polymerizes (e.g., with a light polymerizable component), etc.) by an amount sufficient to increase the strength of said intermediate.

In some embodiments, the light polymerizable monomers and/or prepolymers form a solid polymer scaffold during said stereolithography step (b), which scaffold degrades during said heating step (d) and forms a constituent necessary for the polymerization of said heat polymerizable monomers and/or prepolymers.

In some embodiments, the producing step (b) is carried out by stereolithography (e.g., bottom-up stereolithography).

In some embodiments, the producing step (b) is carried out by continuous liquid interface production.

Still further provided is a three-dimensional object produced by a method or resin as taught herein, wherein samples of the composition that are configured for testing according to UL 94 and have a thickness of 2 millimeters achieve a UL 94 V-0 rating.

The foregoing and other objects and aspects of the present invention are explained in greater detail in the drawings herein and the specification set forth below. The disclosures of all United States patent references cited herein are to be incorporated herein by reference.

DETAILED DESCRIPTION OF ILLUSTRATIVE EMBODIMENTS

The present invention is now described more fully hereinafter with reference to the accompanying drawings, in which embodiments of the invention are shown. This invention may, however, be embodied in many different forms and should not be construed as limited to the embodiments set forth herein; rather these embodiments are provided so that this disclosure will be thorough and complete and will fully convey the scope of the invention to those skilled in the art.

As used herein, the term "and/or" includes any and all possible combinations or one or more of the associated listed items, as well as the lack of combinations when interpreted in the alternative ("or").

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and claims and should not be interpreted in an idealized or overly formal sense unless expressly so defined herein. Well-known functions or constructions may not be described in detail for brevity and/or clarity.

"Shape to be imparted to" refers to the case where the shape of the intermediate object slightly changes between formation thereof and forming the subsequent three-dimensional product, typically by shrinkage (e.g., up to 1, 2 or 4 percent by volume), expansion (e.g., up to 1, 2 or 4 percent by volume), removal of support structures, or by intervening forming steps (e.g., intentional bending, stretching, drilling, grinding, cutting, polishing, or other intentional forming after formation of the intermediate product, but before formation of the subsequent three-dimensional product).

1. Resins.

Dual cure polymerizable liquids (or "resins") useful in additive manufacturing, particularly for stereolithography techniques such as continuous liquid interface production (CLIP) are known and described in, for example, J. Rolland et al., U.S. Pat. Nos. 9,453,142, 9,598,606, 9,676,963, and US 2016/01600077. In general, such resins can comprise: (a) light-polymerizable monomers and/or prepolymers that can form an intermediate object (typically in the presence of a photocatalyst); and (b) heat-polymerizable (or otherwise further polymerizable) monomers and/or prepolymers.

A. Light-polymerizable monomers and/or prepolymers. Sometimes also referred to as "Part A" of the resin, these are monomers and/or prepolymers that can be polymerized by exposure to actinic radiation or light. This resin can have a functionality of 2 or higher (though a resin with a functionality of 1 can also be used when the polymer does not dissolve in its monomer). A purpose of Part A is to "lock" the shape of the object being formed or create a scaffold for the one or more additional components (e.g., Part B). Importantly, Part A is present at or above the minimum quantity needed to maintain the shape of the object being formed after the initial solidification during photolithography. In some embodiments, this amount corresponds to less than ten, twenty, or thirty percent by weight of the total resin (polymerizable liquid) composition.

Examples of suitable reactive end groups suitable for Part A constituents, monomers, or prepolymers include, but are not limited to: acrylates, methacrylates, α-olefins, N-vinyls, acrylamides, methacrylamides, styrenics, epoxides, thiols, 1,3-dienes, vinyl halides, acrylonitriles, vinyl esters, maleimides, and vinyl ethers.

An aspect of the solidification of Part A is that it provides a scaffold in which a second reactive resin component, termed "Part B," can solidify during a second step, as discussed further below.

B. Heat-polymerizable monomers and/or prepolymers. Sometimes also referred to as "Part B", these constituents may comprise, consist of or consist essentially of a mix of monomers and/or prepolymers that possess reactive end groups that participate in a second solidification reaction during or after the Part A solidification reaction. In general, for dual cure resins, examples of methods used to solidify Part B include, but are not limited to, contacting the object or scaffold to heat, water or water vapor, light at a different wavelength than that at which Part A is cured, catalysts, (with or without additional heat), evaporation of a solvent from the polymerizable liquid (e.g., using heat, vacuum, or a combination thereof), microwave irradiation, etc., including combinations thereof. In some embodiments, heat curing of the "Part B" resins is preferred.

Examples of suitable reactive end group pairs suitable for Part B constituents, monomers or prepolymers include, but are not limited to: epoxy/amine, epoxy/hydroxyl, oxetane/amine, oxetane/alcohol, isocyanate*/hydroxyl, isocyanate*/amine, isocyanate/carboxylic acid, anhydride/amine, amine/carboxylic acid, amine/ester, hydroxyl/carboxylic acid, hydroxyl/acid chloride, amine/acid chloride, vinyl/Si—H (hydrosilylation), Si—Cl/hydroxyl, Si—Cl/amine, hydroxyl/aldehyde, amine/aldehyde, hydroxymethyl or alkoxymethyl amide/alcohol, aminoplast, alkyne/azide (also known as one embodiment of "Click Chemistry," along with additional reactions including thiolene, Michael additions, Diels-Alder reactions, nucleophilic substitution reactions, etc.), alkene/sulfur (polybutadiene vulcanization), alkene/peroxide, alkene/thiol, alkyne/thiol, hydroxyl/halide, isocyanate*/water (polyurethane foams), Si—OH/hydroxyl, Si—OH/water, Si—OH/Si—H (tin catalyzed silicone), Si—OH/Si—OH (tin catalyzed silicone), perfluorovinyl (coupling to form perfluorocyclobutane), etc., where isocyanate* includes protected isocyanates (e.g. oximes)), diene/dienophiles for Diels-Alder reactions, olefin metathesis polymerization, olefin polymerization using Ziegler-Natta catalysis, ring-opening polymerization (including ring-opening olefin metathesis polymerization, lactams, lactones, siloxanes, epoxides, cyclic ethers, imines, cyclic acetals, etc.), etc. As will be noted from the above, the "Part B" components generally comprise at least a pair of compounds that are reactive with one another (e.g., a polyisocyanate, and a polyamine).

In some embodiments, the heat polymerizable component comprises an epoxy polymer or resin. In some embodiments, the heat polymerizable component comprises a cyanate ester polymer or resin. See WO 2017/040883 and WO 2017/044381 to Carbon, Inc.

Example epoxy resins include, but are not limited to, a bisphenol A epoxy resin, a bisphenol F epoxy resin, a novolac epoxy resin, an aliphatic epoxy resin, a glycidylamine epoxy resin, or a combination thereof. Numerous examples of suitable epoxy resins (and organic hardeners, as described further below) are known. See, e.g., U.S. Pat. Nos. 3,945,972; 3,947,3951 4,833,226; 5,319,004; 6,355,763; 6,881,813; 8,383,025; 9,133,301; etc.

In some embodiments, the epoxy resin comprises an epoxidized vegetable oil. In general, epoxidized vegetable oils can be obtained by the epoxidation of triglycerides of unsaturated fatty acids. They are made by epoxidizing the reactive olefin groups of the naturally occurring triglyceride oils. The olefin groups can be epoxidized with peracids, such as perbenzoic, peracetic and the like, and with hydrogen peroxide. Suitable epoxidized vegetable oils are epoxidized linseed oil, epoxidized soybean oil, epoxidized corn oil, epoxidized cottonseed oil, epoxidized perilla oil, epoxidized safflower oil, etc. See, e.g., U.S. Pat. Nos. 3,051,671; 5,973,082; 8,481,622; and 9,169,386; see also M. Stemmelen et al., A fully biobased epoxy resin from vegetable oils: From the synthesis of the precursors by thiol-ene reaction to the study of the final material, J. Polym Sci. Part A: Polym Chem. 49, 2434-2444 (2011).

In some embodiments, the epoxy resin comprises a catalyzed epoxy resin (which may not require a hardener). In such case, the resin may further include an epoxy homopolymerization catalyst, such as a tertiary amine or imidizole (anionic polymerization) or boron trifluoride (cationic polymerizations).

Example cyanate esters include, but are not limited to, 1,3-, or 1,4-dicyanatobenzene; 1,3,5-tricyanatobenzene; 1,3-, 1,4-, 1,6-, 1,8-, 2,6- or 2,7-dicyanatonaphthalene; 1,3,6-tricyanatoaphthalene; 2,2' or 4,4'-dicyanatobiphenyl; bis(4-cyanathophenyl) methane; 2,2-bis(4-cyanatophenyl) propane; 2,2-bis(3,5-dichloro-4-cyanatophenyl)propane, 2,2-bis(3-dibromo-4-dicyanatophenyl)propane; bis(4-cyanatophenyl)ether; bis(4-cyanatophenyl)thioether; bis(4-cyanatophenyl)sulfone; tris(4-cyanatophenyl)phosphite; tris(4-cyanatophenyl)phosphate; bis(3-chloro-4-cyanatophenyl) methane; 4-cyanatobiphenyl; 4-cumylcyanatobenzene; 2-tert-butyl-1,4-dicyanatobenzene; 2,4-dimethyl-1,3-dicyanatobenzene; 2,5-di-tert-butyl-1,4 dicyanatobenzene; tetramethyl-1,4-dicyanatobenzene; 4-chloro-1,3-dicyanatobenzene; 3,3',5,5'-tetramethyl-4,4' dicyanatodiphenylbis(3- chloro-4-cyanatophenyl)methane; 1,1,1-tris(4-cyanatophenyl)ethane; 1,1-bis(4-cyanatophenyl)ethane; 2,2-bis(3,5-dichloro-4-cyanatophenyl)propane; 2,2-bis(3,5 dibromo-4-cyanatophenyl)propane; bis(p-cyanophenoxyphenoxy)benzene; di(4-cyanatophenyl)ketone; cyanated novolacs produced by reacting a novolac with cyanogen halide; cyanated bisphenol polycarbonate oligomers produced by reacting a bisphenol polycarbonate oligomer with cyanogen halide; mixtures thereof. See also U.S. Pat. No. 4,371,689.

In some embodiments, Part B may comprise an epoxy resin in combination with a cyanate ester resin.

In some embodiments, Part B constituents include a flame retardant group. For example, in some embodiments the constituents may be brominated, i.e., contain one, two, three, four or more bromine groups (—Br) covalently coupled thereto. In some embodiments, the resin composition contains additional components with the flame retardant groups (e.g., with total bromine groups in an amount of from 1, 2, or 5% to 15 or 20% by weight of the polymerizable liquid).

In some embodiments, Part B constituents include epoxy components with flame retardant groups (e.g., brominated epoxy resin). Particular examples include, but are not limited to, a brominated bisphenol resin, such as a brominated bisphenol A epoxy resin, a brominated bisphenol B epoxy resin, a brominated bisphenol E epoxy resin, a brominated bisphenol F epoxy resin, etc., or a combination of two or more thereof. In some embodiments, an oligomeric epoxy component may be used/included (e.g., a brominated epoxy oligomer such as a brominated polybisphenol A epoxy). See, e.g., U.S. Pat. No. 10,227,482 to Arechederra, U.S. Pat. No. 10,100,190 to Shimozawa et al., U.S. Pat. No. 9,193,858 to Su et al., U.S. Pat. No. 8,991,321 to Bar-Yaakov et al., and U.S. Pat. No. 5,912,308 to Das et al., which are incorporated by reference herein.

C. Additional resin ingredients. Photoinitiators included in the polymerizable liquid (resin) can be any suitable photoiniator, including type I and type II photoinitiators and including commonly used UV photoinitiators, examples of which include, but are not limited to, acetophenones (diethoxyacetophenone for example), phosphine oxides diphenyl(2,4,6-trimethylbenzoyl)phosphine oxide, phenylbis(2,4,6-trimethylbenzoyl) phosphine oxide (PPO), Irgacure 369, etc. See, e.g., U.S. Pat. No. 9,453,142 to Rolland et al.

The liquid resin or polymerizable material can have solid particles suspended or dispersed therein. Any suitable solid particle can be used, depending upon the end product being fabricated. The particles can be metallic, organic/polymeric, inorganic, or composites or mixtures thereof. The particles can be nonconductive, semi-conductive, or conductive (including metallic and non-metallic or polymer conductors); and the particles can be magnetic, ferromagnetic, paramagnetic, or nonmagnetic. The particles can be of any suitable shape, including spherical, elliptical, cylindrical, etc. The particles can be of any suitable size (for example, ranging from 1 nm to 20 μm average diameter).

The particles can comprise an active agent or detectable compound as described below, though these may also be provided dissolved or solubilized in the liquid resin as also discussed below. For example, magnetic or paramagnetic particles or nanoparticles can be employed.

The liquid resin can have additional ingredients solubilized therein, including pigments, dyes, active compounds or pharmaceutical compounds, detectable compounds (e.g., fluorescent, phosphorescent, radioactive), etc., again depending upon the particular purpose of the product being fabricated. Examples of such additional ingredients include, but are not limited to, proteins, peptides, nucleic acids (DNA, RNA) such as siRNA, sugars, small organic compounds (drugs and drug-like compounds), etc., including combinations thereof.

Hardeners. Any suitable hardener may be used as an additional component (see, e.g., U.S. Pat. Nos. 5,599,856; 6,656,979; 8,632,654; and 9,315,698). In some embodiments, the hardener can react with an epoxide. In some embodiments, the hardener comprises an amine or polyamine (e.g., an aromatic amine or polyamine, a cycloaliphatic amine or polyamine, an aliphatic amine or polyamine such as a polyether amine, etc.).

In some embodiments, the hardener comprises a thiol or polythiol, an allyl or polyallyl (diallyls, triallyls); a maleimide; a vinyl ether, etc.

Particular examples of suitable thiol hardeners include, but are not limited to, 4,4'-dimercaptodiphenylether, 4,4'-dimercaptobiphenyl, trimethylolpropane tris(3-mercaptopropionate), pentaerythritol tetrakis(3-mercaptopropionate), 1,3,5-tris(3-mercaptopropyl)-1,3,5-triazine-2,4,6-trione, etc.

Examples of suitable allyls include, but are not limited to, allyl (meth)acrylate, 2,2'-diallylbisphenol A and triallyl-1,3,5-triazine-2,4,6-(1H,3H,5H)-trione.

In some embodiments, the hardener comprises a latent hardener (including mixtures thereof); that is, a hardener having a low reactivity at lower temperatures, and/or which is sparingly soluble at lower temperatures, such that the hardener can be more stable at room temperature, but then activated upon heating. Numerous examples of latent hardeners are known (See, e.g., U.S. Pat. No. 8,779,036; see also U.S. Pat. No. 4,859,761). Particular examples include, but are not limited to, substituted guanidines and aromatic amines, such as dicyandiamide, benzoguanamine, o-tolylbiguanidine, bis(4-aminophenyl)sulfone (also known as diamino diphenylsulfone: DDS), bis(3-aminophenyl)sulfone, 4,4'-methylenediamine, 4-aminobenzenesulfonamide, 1,2- or 1,3- or 1,4-benzenediamines, bis(4-aminophenyl)-1,4-diisopropylbenzene (e.g., EPON 1061 from Shell), bis(4-amino-3,5-dimethylphenyl)-1,4-diisopropylbenzene (e.g., EPON 1062 from Shell), bis(aminophenyl) ether, diaminobenzophenones, 2,6-diaminopyridine, 2,4-toluenediamine, diaminodiphenylpropanes, 1,5-diaminonaphthalene, xylenediamines, 1,1-bis-4-aminophenylcyclohexane, methylenebis(2,6-diethylaniline) (e.g., LONZACURE® M-DEA from Lonza), methylenebis(2-isopropyl-6-methylaniline) (e.g. LONZACURE® M-MIPA from Lonza), methylenebis(2,6-diisopropylaniline) (e.g., LONZACURE® M-DIPA from Lonza), 4-aminodiphenylamine, diethyltoluenediamine, phenyl-4,6-diaminotriazine, and lauryl-4,6-diaminotriazine. Still other examples include N-acylimidazoles such as 1-(2',4',6'-trimethylbenzoyl)-2-phenylimidazole or 1-benzoyl-2-isopropylimidazole (see, e.g., U.S. Pat. Nos. 4,436,892 and 4,587,311); Cyanoacetyl compounds such as neopentyl glycol biscyanoacetate, N-isobutylcyanoacetamide, 1,6-hexamethylene biscyanoacetate or 1,4-cyclohexanedimethanol biscyanoacetate (see, e.g., U.S. Pat. No. 4,283,520); N-cyanoacylamide compounds such as N,N'-dicyanoadipic diamide (see, e.g., U.S. Pat. Nos. 4,529,821, 4,550,203, and 4,618,712; acylthiopropylphenols (see, e.g., U.S. Pat. No. 4,694,096) and the urea derivatives such as toluene-2,4-bis(N,N-dimethylcarbamide) (see, e.g., U.S. Pat. No. 3,386,955); and aliphatic or cycloaliphatic diamines and polyamines if they are sufficiently unreactive. An example which may be mentioned here is polyetheramines, e.g., JEFFAMINE® 230 and 400. Aliphatic or cycloaliphatic diamines or polyamines whose reactivity has been reduced by steric and/or electronic influencing factors or/and are sparingly soluble or have a high melting point, e.g., JEFFLINK® 754 (Huntsman) or CLEARLINK® 1000 (Dorf Ketal) can also be used.

Chain extenders. In some embodiments, chain extenders may include those that can react with epoxides to grow linear chains. Particular examples include, but are not limited to, dihydric phenolic compounds such as bisphenol A, bisphenol S (4,4'-sulfonyldiphenol), bisphenol K, etc. See U.S. Pat. No. 4,594,219 to Berthram et al. In some embodiments, chain extenders may include a flame retardant group. For example, in some embodiments the chain extenders may be brominated, i.e., contain one, two, three, four or more bromine groups covalently coupled to the chain extenders. A non-limiting example of a brominated chain extender is tetrabromobisphenol A.

Chain extender catalysts. In some embodiments, chain extender catalysts may include those that catalyze or promote the reaction of dihydric phenolic chain extenders with epoxides to grow linear chains. Examples of chain extender catalysts include, but are not limited to, onium salts, preferably phosphonium salts, and even more preferably phosphonium halides (e.g., tetrabutylphosphonium bromide, ethyl triphenylphosphonium iodide, etc.). See U.S. Pat. Nos. 4,767,832; 4,352,918; and 3,477,990, which are incorporated herein by reference. In some embodiments, the amount of the catalyst used may be from 0.01 to 10 percent, preferably from 0.05 to 5 percent, or from 0.1 to 2 percent, by weight of the composition.

Dyes/non-reactive light absorbers. In some embodiments, polymerizable liquids for carrying out the present invention include a non-reactive pigment or dye that absorbs light, particularly UV light. Suitable examples of such light absorbers include, but are not limited to: (i) titanium dioxide (e.g., included in an amount of from 0.05 or 0.1 to 1 or 5 percent by weight), (ii) carbon black (e.g., included in an amount of from 0.05 or 0.1 to 1 or 5 percent by weight), and/or (iii) an organic ultraviolet light absorber such as a hydroxybenzophenone, hydroxyphenylbenzotriazole, oxanilide, benzophenone, thioxanthone, hydroxypenyltriazine, and/or benzotriazole ultraviolet light absorber (e.g., Mayzo BLS® 1326) (e.g., included in an amount of 0.001 or 0.005 to 1, 2 or 4 percent by weight). Examples of suitable organic ultraviolet light absorbers include, but are not limited to, those described in U.S. Pat. Nos. 3,213,058; 6,916,867; 7,157,586; and 7,695,643, which are incorporated herein by reference.

Fillers. Any suitable filler may be used in connection with the present invention, depending on the properties desired in the part or object to be made. Thus, fillers may be solid or liquid, organic or inorganic, and may include reactive and non-reactive rubbers, siloxanes, acrylonitrile-butadiene rubbers, reactive and non-reactive thermoplastics (including but not limited to: poly(ether imides), maleimide-styrene terpolymers, polyarylates, polysulfones and polyethersulfones, etc.) inorganic fillers such as silicates (such as talc, clays, silica, mica), glass, carbon nanotubes, graphene, cellulose nanocrystals, etc., including combinations of all of the foregoing. Suitable fillers include tougheners, such as core-shell rubbers, as discussed below.

Tougheners. One or more polymeric and/or inorganic tougheners can be used as a filler in the present invention. The toughener may be uniformly distributed in the form of particles in the cured product. The particles could be less than 5 microns (μm) in diameter. Such tougheners include, but are not limited to, those formed from elastomers, branched polymers, hyperbranched polymers, dendrimers, rubbery polymers, rubbery copolymers, block copolymers, core-shell particles, oxides or inorganic materials such as clay, polyhedral oligomeric silsesquioxanes (POSS), carbonaceous materials (e.g., carbon black, carbon nanotubes, carbon nanofibers, fullerenes), ceramics and silicon carbides, with or without surface modification or functionalization.

Core-shell rubbers. Core-shell rubbers are particulate materials (particles) having a rubbery core. Such materials are known and described in, for example, US Patent Application Publication No. 20150184039, as well as US Patent Application Publication No. 20150240113, and U.S. Pat. Nos. 6,861,475, 7,625,977, 7,642,316, 8,088,245, and elsewhere. In some embodiments, the core-shell rubber particles are nanoparticles (i.e., having an average particle size of less than 1000 nanometers (nm)). Generally, the average particle size of the core-shell rubber nanoparticles is less than 500 nm, e.g., less than 300 nm, less than 200 nm, less than 100 nm, or even less than 50 nm. Typically, such particles are spherical, so the particle size is the diameter; however, if the particles are not spherical, the particle size is defined as the longest dimension of the particle. Suitable core-shell rubbers include, but are not limited to, those sold by Kaneka Corporation under the designation Kaneka Kane Ace, including the Kaneka Kane Ace 15 and 120 series of products, including Kaneka Kane Ace MX 120, Kaneka Kane Ace MX 136, Kaneka Kane Ace MX 137, Kaneka Kane Ace MX 153, Kaneka Kane Ace MX 154, Kaneka Kane Ace MX 156, Kaneka Kane Ace MX 170, Kaneka Kane Ace MX 257 and Kaneka Kane Ace MX 120 core-shell rubber dispersions, and mixtures thereof, and those sold by Dow under the designation Paraloid™.

Organic diluents. Diluents for use in the present invention are preferably reactive organic diluents; that is, diluents that will degrade, isomerize, cross-react, or polymerize, with themselves or a light polymerizable component, during the additive manufacturing step. In general, the diluent(s) are included in an amount sufficient to reduce the viscosity of the polymerizable liquid or resin (e.g., to not more than 6,000, 5,000, 4,000, or 3,000 centipoise at 25 degrees Centigrade. Suitable examples of diluents include, but are not limited to, N,N'-dimethylacrylamide, n-vinyl-2-pyrrolidone, n-vinyl formamide, n-vinyl caprolactam, acryloylmorpholine, and mixtures of two or more thereof. The diluent may be included in the polymerizable liquid in any suitable amount, typically from 1, 5 or 10 percent by weight, up to about 30 or 40 percent by weight, or more.

Flame retardant oligomers. Flame retardant oligomers, which may be reactive or non-reactive, may also be included in the resins of the present invention. Examples include, but are not limited to, brominated oligomers such as ICL Flame Retardant F-3100, F-3020, F-2400, F-2016, etc. (ICL Industrial Products). See also U.S. 2013/0032375 to Pierre et al.

Flame retardant synergists. Flame retardant synergists, which when combined with halogens such as bromine synergize flame retardant properties, are known. Examples include, but are not limited to, antimony synergists such as antimony oxides (e.g., antimony trioxide, antimony pentaoxide, etc.), aromatic amines such as melamine, etc. See U.S. Pat. No. 9,782,947. In some embodiments, the resin composition may contain synergists in an amount of from 0.1, 0.5 or 1% to 3, 4, or 5% by weight. In some embodiments, an antimony pentoxide functionalized with triethanolamine or ethoxylated amine may be used, which is available as BurnEX® colloidal additives such as BurnEX® A1582, BurnEX® ADP480, and BurnEX® ADP494 (Nyacol® Nano Technologies, Ashland, Mass.).

Smoke suppression agents. The resins described herein may optionally contain a smoke suppression agent. Such smoke suppression agents may include, but are not limited to, molybdenum oxides, including $MoO_3$, ammonium octamolybdate (AOM), calcium and zinc molybdates; iron, copper, manganese, cobalt or vanadyl phthalocyanines, which may be used as synergist with octabromobiphenyl; ferrocenes (organometallic iron), which may be used in combination with Cl paraffin and/or antimony oxide; hydrated Iron (III) oxide; hydrated zinc borates; zinc stannate and zinc hydroxy stannate; hydrates, carbonates and borates; alumina trihydrate (ATH); magnesium hydroxide; metal halides of iron, zinc, titanium, copper, nickel, cobalt, tin, aluminum, antimony and cadmium, which are non-hydrous and non-ionic, and which may be used with complexing agents such as quaternary ammonium compounds, quaternary phosphonium compounds, tertiary sulfonium compounds, organic orthosilicates, the partially hydrolyzed derivatives of organic orthosilicates, or a combination including one or more of them; nitrogen compounds, including ammonium polyphosphates (monammonium phosphate, diammonium phosphate, and the like); and FeOOH. Such smoke suppression agents may be used singly or in combination, optionally in amounts of about 0.1 to about 20 wt. % of the resin composition or by weight of the polymer resins in the composition or, in some cases, about 1 to about 5 wt. % by weight of the composition or by weight of the polymer resins. See US 2009/0306258 to Siripurapu et al.

2. Methods of Making.

Polymerizable liquids or resins as described herein are used to make three-dimensional objects in a first "light" cure (typically by additive manufacturing) which generates a "green" intermediate object, followed by a second cure of that intermediate object.

Techniques for additive manufacturing are known. Suitable techniques include bottom-up or top-down additive manufacturing, generally known as stereolithography. Such methods are known and described in, for example, U.S. Pat. No. 5,236,637 to Hull, U.S. Pat. Nos. 5,391,072 and 5,529,473 to Lawton, U.S. Pat. No. 7,438,846 to John, U.S. Pat. No. 7,892,474 to Shkolnik, U.S. Pat. No. 8,110,135 to El-Siblani, U.S. Patent Application Publication Nos. 2013/0292862 to Joyce, and US Patent Application Publication No. 2013/0295212 to Chen et al. The disclosures of these patents and applications are incorporated by reference herein in their entireties.

In some embodiments, the intermediate object is formed by continuous liquid interface production (CLIP). CLIP is known and described in, for example, U.S. Pat. Nos. 9,211,678, 9,205,601, 9,216,546, and in J. Tumbleston, D. Shirvanyants, N. Ermoshkin et al., Continuous liquid interface production of 3D Objects, *Science* 347, 1349-1352 (2015). See also R. Janusziewcz et al., Layerless fabrication with continuous liquid interface production, *Proc. Natl. Acad. Sci. USA* 113, 11703-11708 (2016). In some embodiments, CLIP employs features of a bottom-up three-dimensional fabrication as described above, but the irradiating and/or said advancing steps are carried out while also concurrently maintaining a stable or persistent liquid interface between the growing object and the build surface or window, such as by: (i) continuously maintaining a dead zone of polymerizable liquid in contact with said build surface, and (ii) continuously maintaining a gradient of polymerization zone (such as an active surface) between the dead zone and the solid polymer and in contact with each thereof, the gradient of polymerization zone comprising the first component in partially-cured form. In some embodiments of CLIP, the optically transparent member comprises a semipermeable member (e.g., a fluoropolymer), and the continuously maintaining a dead zone is carried out by feeding an inhibitor of polymerization through the optically transparent member, thereby creating a gradient of inhibitor in the dead zone and optionally in at least a portion of the gradient of polymerization zone. Other approaches for carrying out CLIP that can be used in the present invention and potentially obviate the need for a semipermeable "window" or window structure include utilizing a liquid interface comprising an immiscible liquid (see L. Robeson et al., WO 2015/164234), generating oxygen as an inhibitor by electrolysis (see I. Craven et al., WO 2016/133759), and incorporating magnetically positionable particles to which the photoactivator is coupled into the polymerizable liquid (see J. Rolland, WO 2016/145182).

Other examples of methods and apparatus for carrying out particular embodiments of CLIP include, but are not limited to, those described in B. Feller, US Patent App. Pub. No. US 2018/0243976 (published Aug. 30, 2018); M. Panzer and J. Tumbleston, US Patent App Pub. No. US 2018/0126630 (published May 10, 2018); K. Willis and B. Adzima, US Patent App Pub. No. US 2018/0290374 (Oct. 11, 2018); Batchelder et al., Continuous liquid interface production system with viscosity pump, US Patent Application Pub. No. US 2017/0129169; Sun and Lichkus, Three-dimensional fabricating system for rapidly producing objects, US Patent Application Pub. No. US 2016/0288376; Willis et al., 3d print adhesion reduction during cure process, US Patent Application Pub. No. US 2015/0360419; Lin et al., Intelligent 3d printing through optimization of 3d print parameters, US Patent Application Pub. No. US 2015/0331402; and D. Castanon, Stereolithography System, US Patent Application Pub. No. US 2017/0129167.

After the intermediate three-dimensional object is formed, it is optionally washed, optionally dried (e.g., air dried) and/or rinsed (in any sequence). It is then further cured, preferably by heating (although further curing may in some embodiments be concurrent with the first cure, or may be by different mechanisms such as contacting to water, as described in U.S. Pat. No. 9,453,142 to Rolland et al.).

Heating may be active heating (e.g., in an oven, such as an electric, gas, solar oven or microwave oven, or combination thereof), or passive heating (e.g., at ambient (room) temperature). Active heating will generally be more rapid than passive heating and in some embodiments is preferred, but passive heating—such as simply maintaining the intermediate at ambient temperature for a sufficient time to effect further cure—is in some embodiments preferred.

In some embodiments, the heating step is carried out at at least a first (oven) temperature and a second (oven) temperature, with the first temperature greater than ambient temperature, the second temperature greater than the first temperature, and the second temperature less than 300° C. (e.g., with ramped or step-wise increases between ambient temperature and the first temperature, and/or between the first temperature and the second temperature).

For example, the intermediate may be heated in a stepwise manner at a first temperature of about 70° C. to about 150° C., and then at a second temperature of about 150° C. to 200 or 250° C., with the duration of each heating depending on the size, shape, and/or thickness of the intermediate. In another embodiment, the intermediate may be cured by a ramped heating schedule, with the temperature ramped from ambient temperature through a temperature of 70 to 150° C., and up to a final (oven) temperature of 250 or 300° C., at a change in heating rate of 0.5° C. per minute, to 5° C. per minute. (See, e.g., U.S. Pat. No. 4,785,075).

3. Three-Dimensional Objects.

As noted above, resins and methods as taught herein may be useful to form dual cure three-dimensional objects that are flame retardant. In some embodiments, samples of the composition that are configured for testing according to UL 94 have a thickness of 2 millimeters may achieve a UL 94 V-0, V-1, or V-2 rating. For example, in some embodiments, samples of the composition configured for testing according to UL 94 and having a thickness of 2 millimeters may achieve a UL 94 V-0 rating.

Figure 1:
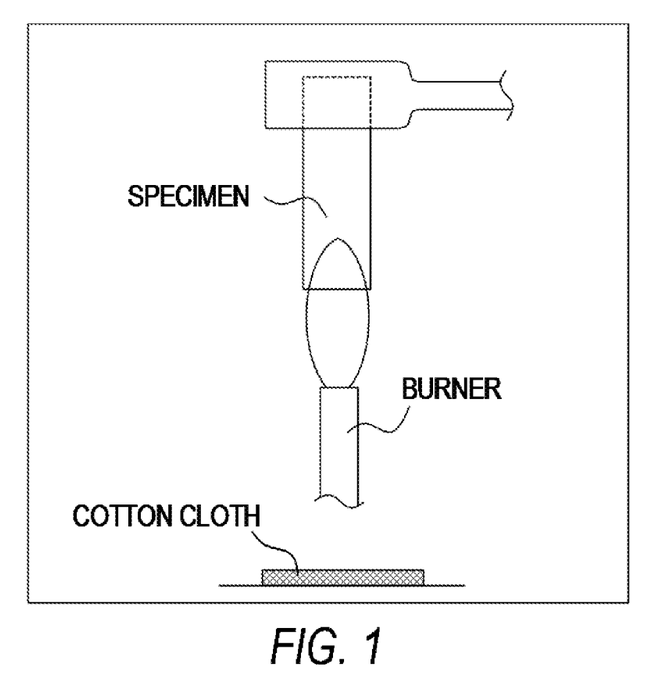
FIG. 1 presents the schematic of a setup for a UL94V Verital Burning Test of a specimen for classification according to V1, V1 or V2, with the Test Criteria of afterflame time of specimen/drip of flaming particles. In all of these burning tests, an open flame is applied for a specified time to the specimen. As the burning behavior also depends on the thickness of the material, the thickness of the specimen should be indicated.

Flammability tests may be performed following the procedure of Underwriter's Laboratory Bulletin 94 ("UL 94"), available at standardscatalog.ul.com. Flame is applied in the vertical setup shown in FIG. 1, and materials may be classified as V-0, V-1, or V-2, according to the criteria in Table 1. Sample Dimension: Length: 125 mm, Width: 15 mm and three different thickness: 3 mm, 2 mm and 1.5 mm.

TABLE 1

| UL 94 Procedure | | | |
|---|---|---|---|
| Flame height | 20 mm | | |
| Flame application time | 2 × 10 s | | |
| The second flame application time beings as soon as the first burning time ends | | | |

| Flammability rating UL 94 V | | | |
|---|---|---|---|
| Test criteria | V-0 | V-1 | V-2 |
| Burning time of each individual test specimen(s) (after first and second flame applications) | ≤10 | ≤30 | ≤30 |
| Total burning time(s) (10 flaime applications) | ≤50 | ≤250 | ≤250 |
| Burning and afterglow times after second flame application(s) | ≤30 | ≤60 | ≤60 |
| Dripping of burning specimens (ignition of cotton batting) | no | no | yes |
| Cobustion up to holding clamp (specimens completely burned) | no | no | no |

Table 2 presents a summary of test procedures and requirements of the four UL94 classifications (HB, V0, V1, V2):

TABLE 2

| | UL 94 Test Procedures | | | |
|---|---|---|---|---|
| | Horizontal Test UL94 | Vertical Test UL94 | | |
| Classification | HB | V0 | V1 | V2 |
| Number of specimen | 3 | 3 | 5 | 5 | 5 |
| Thisckness of specimen | <3 mm | 3 to 13 mm | up to max. 13 mm | | |
| 1$^{st}$ flame application | 30 sec. | 30 sec. | 10 sec. | 10 sec. | 10 sec. |
| 2$^{nd}$ flame application | — | — | 10 sec. | 10 sec. | 10 sec. |
| Burning rate | max. 75 mm/min | max. 40 mm/min | — | — | — |

TABLE 2-continued

| | UL 94 Test Procedures | | | |
|---|---|---|---|---|
| | Horizontal Test UL94 | Vertical Test UL94 | | |
| Classification | HB | V0 | V1 | V2 |
| Afterflame time after 1$^{st}$ flame application for each individual specimen | — | — | max. 10 sec. | max. 30 sec. | max. 30 sec. |
| Afterflame time after 2$^{nd}$ flame application for each individual specimen | — | — | max. 30 sec. | max. 60 sec. | max. 60 sec. |
| Total afterflame time for all 5 specimen after 1$^{st}$ and 2$^{nd}$ flame application | — | — | max. 50 sec. | max. 250 sec. | max. 250 sec. |
| Afterflame or afterglow of any specimen up to its end allowed | yes | yes | no | no | no |
| Cotton indicator ignited by flaming particles or drops allowed | — | — | no | no | yes |

Procedure: Apply flame for 10 sec, note the burn time. After extinguish, apply flame for another 10 sec, note the burn time. Total of these two times is used to determine the classification (e.g., V0/V1).

The present invention is explained in greater detail in the following non-limiting Examples.

Example A: By Chain Extension: Tetra Bromo Bisphenol A

Fifteen grams of a commercially available urethane acrylate (CN983), 5 grams of commercially available acrylate monomer (CN2601), 29 grams of a Bisphenol A diglycidyl ether resin with core-shell rubber modifiers (Kaneka MX153), 0.95 grams of 3,3'-diaminodiphenyl sulfone, 0.95 grams of 4,4'-diaminodiphenyl sulfone, 21 grams of tetra-bromobisphenol A (structure below), 6 grams of Nyacol APE 1540 (nonaqueous dispersion of colloidal antimony pentoxide), and 0.8 grams of phenylbis(2,4,6-trimethylbenzoyl)phosphine oxide were mixed with 23 grams of N,N'-dimethylacrylamide in a planetary centrifugal mixer to yield a homogeneous resin.

tetrabromobisphenol A

This resin was formed into a three-dimensional intermediate using continuous liquid interface production (CLIP) on a Carbon Inc. M2 printer (Carbon Inc., Redwood City, Calif.) operated in continuous exposure mode, using a 385 nm LED projector with a light intensity of 9 mW/cm² at a speed of 30 mm/hour. The formed material was cured in a convection oven at temperatures up to 220° C. to yield the desired product. The mechanical properties of dual cured products produced from such resins were evaluated by producing mechanical test samples in this manner, and are given in Table 3 below.

Example B1: By Brominated Epoxy: Diglycidyl Ether of Brominated Bisphenol A

Fifteen grams of a commercially available urethane acrylate (CN983), 5 grams of commercially available acrylate monomer (CN2601), 26 grams of a Bisphenol A diglycidyl ether resin with core-shell rubber modifiers (Kaneka MX153), 4.8 grams of 3,3'-diaminodiphenyl sulfone, 4.8 grams of 4,4'-diaminodiphenyl sulfone, 22 grams of diglycidyl ether of brominated bisphenol A (structure below), 5 grams of Nyacol APE 1540, and 0.8 grams of phenylbis(2,4,6-trimethylbenzoyl)phosphine oxide were mixed with 23 grams of N,N'-dimethylacrylamide in a planetary centrifugal mixer to yield a homogeneous resin.

diglycidyl ether of brominated bisphenol A

This resin was formed into a three-dimensional intermediate using continuous liquid interface production (CLIP) in continuous exposure mode, using a 385 nm LED projector with a light intensity of 9 mW/cm² at a speed of 30 mm/hour. The formed material was cured in a convection oven at temperatures up to 220° C. to yield the desired product. The mechanical properties of dual cured products produced from such resins were evaluated by producing mechanical test samples in this manner, and are given in Table 3 below.

TABLE 3

| Material Properties | Example A | Example B1 |
|---|---|---|
| Tensile modulus (MPa) | 2800-3200 | 2800-3200 |
| Tensile strength at break (MPa) | 79.4 | 80.2 |
| Elongation at break (%) | 8.25 | 7 |

TABLE 3-continued

| Material Properties | Example A | Example B1 |
|---|---|---|
| Glass transition temperature (E', tanD) | 119 C. | 135 C. |
| Izod impact strength, notched (J/m) | 34.2 | 41 |
| Viscosity (cP) @25 C. | 745 | 1300 |
| Flammability Test (UL 94) - 3 mm, 2.5 mm | V0 | V0 |

The UL 94 vertical flammability tests were done in accordance with the description in the specification provided above.

Notched Izod Impact Strength may be measured in accordance with ASTM D256.

Heat deflection temperature may be measured in accordance with ASTM D648.

Example B2: By Brominated Epoxy: Diglycidyl Ether of Brominated Bisphenol A and Brominated Oligomeric Epoxy Twenty one grams of a commercially available urethane acrylate (CN983), 22 grams of a Bisphenol A diglycidyl ether resin with core-shell rubber modifiers (Kaneka MX153), 3.7 grams of 3,3'-diaminodiphenyl sulfone, 3.7 grams of 4,4'-diaminodiphenyl sulfone, 8 grams of brominated bisphenol A epoxy (diglycidyl ether of brominated bisphenol A, structure shown above), 15 grams of brominated oligomeric epoxy (F-2016, brominated polybisphenol A epoxy, m.wt. 1600, structure shown below), 3 grams of Nyacol BurnEx ADP 494, 0.8 grams of phenylbis(2,4,6-trimethylbenzoyl)phosphine oxide, 0.005% of phenothiazine, 0.625% of 1,1-Bis(tert-amylperoxy)cyclohexane solution, and 0.37% of black pigment (Wikoff) were mixed with 22 grams of N,N'-dimethylacrylamide in a planetary centrifugal mixer to yield a homogeneous resin.

brominated polybisphenol A epoxy (F-2016)

This resin was formed into a three-dimensional intermediate using continuous liquid interface production (CLIP) in continuous exposure mode, using a 385 nm LED projector with a light intensity of 9 mW/cm2 at a speed of 30 mm/hour. The formed material was cured in a convection oven at temperatures up to 220° C. to yield the desired product. The mechanical properties of dual cured products produced from such resins were evaluated by producing mechanical test samples in this manner, and are given in Table 4 below.

TABLE 4

| Material Properties | Example B2 |
|---|---|
| Tensile modulus (MPa) | 3200-2500 |
| Tensile strength at break (MPa) | 85-95 MPa |

TABLE 4-continued

| Material Properties | Example B2 |
| --- | --- |
| Elongation at break (%) | 7-8% |
| Glass transition temperature (E', tanD) | 142 C. |
| Izod impact strength, notched (J/m) | 46 |
| Viscosity (cP) @25 C. | 1525 |
| Flammability Test (UL 94) - 3 mm, 2.5 mm, 1.5 mm | V0 |

Examples C and D: Non Reactive Brominated Flame Retardant

In the following examples, bromine was incorporated in the network using a non reactive brominated oligomer. Mwt 15000, CAS 135229-48-0, F-3100 (ICL Industrial Products)

F-3100

Example C

Fifteen grams of a commercially available urethane acrylate (CN983), 5 grams of commercially available acrylate monomer (CN2601), 28 grams of a Bisphenol A diglycidyl ether resin with core-shell rubber modifiers (Kaneka MX153), 3.2 grams of 3,3'-diaminodiphenyl sulfone, 3.2 grams of 4,4'-diaminodiphenyl sulfone, 23 grams of F-3100 (structure above), 6 grams of Nyacol APE 1540, and 0.8 grams of phenylbis(2,4,6-trimethylbenzoyl)phosphine oxide were mixed with 23 grams of N,N'-dimethylacrylamide in a planetary centrifugal mixer to yield a homogeneous resin. This resin was formed into a three-dimensional intermediate using continuous liquid interface production (CLIP) in continuous exposure mode, using a 385 nm LED projector with a light intensity of 9 mW/cm² at a speed of 30 mm/hour. The formed material was cured in a convection oven at temperatures up to 220° C. to yield the desired product. The mechanical properties of dual cured products produced from such resins were evaluated by producing mechanical test samples in this manner, and are given in Table 5 below.

Example D

Fifteen grams of a commercially available urethane acrylate (CN983), 5 grams of commercially available acrylate monomer (CN2601), 28 grams of a Bisphenol A diglycidyl ether resin with core-shell rubber modifiers (Kaneka MX153), 3.2 grams of 3,3'-diaminodiphenyl sulfone, 3.2 grams of 4,4'-diaminodiphenyl sulfone, 12 grams of F-3100, 10 grams of Tetrabromobisphenol A, 6 grams of Nyacol APE 1540, and 0.8 grams of phenylbis(2,4,6-trimethylbenzoyl)phosphine oxide were mixed with 23 grams of N,N'-dimethylacrylamide in a planetary centrifugal mixer to yield a homogeneous resin. This resin was formed into a three-dimensional intermediate using continuous liquid interface production (CLIP) in continuous exposure mode, using a 385 nm LED projector with a light intensity of 9 mW/cm² at a speed of 30 mm/hour. The formed material was cured in a convection oven at temperatures up to 220° C. to yield the desired product. The mechanical properties of dual cured products produced from such resins were evaluated by producing mechanical test samples in this manner, and are given in Table 5 below.

TABLE 5

| Material Properties | Example C | Example D |
| --- | --- | --- |
| Tensile modulus (MPa) | | |
| Tensile strength at break (MPa) | | |
| Elongation at break (%) | | |
| Glass transition temperature (E', tanD) | | 120 C. |
| Izod impact strength, notched (J/m) | | 34 |
| Viscosity (cP) @25 C. | >100,000 | 62,500 |
| Flammability Test (UL 94) - 3 mm, 2.5 mm | | |

The UL 94 vertical flammability tests are done in accordance with the description in the specification provided above.

Notched Izod Impact Strength may be measured in accordance with ASTM D256.

Heat deflection temperature may be measured in accordance with ASTM D648.

Examples E and F: Using Antimony Pentoxide Versus Antimony Trioxide

Antimony Pentoxide/Trioxide is used as a synergist in the brominated formulations to improve the flame retardation efficiency. However, in some formulations, antimony pentoxide in a colloidal dispersion matrix may be preferable as antimony pentoxide is smaller in particle size and has higher particle stability in the formulation as compared to the antimony trioxide particles. Smaller particle size helps in less scattering of the light, which aids in faster printing.

TABLE 6

Formulations with Antimony Pentoxide or Antimony Trioxide

| Components | Example E Weight % | Example F Weight % |
| --- | --- | --- |
| CN 983 | 15 | 15 |
| CN 153 (acrylated glycidyl ether of Bisphenol A) | 4.5 | 4.5 |
| DMAA (N,N'-dimethylacrylamide) | 24.5 | 25 |

TABLE 6-continued

Formulations with Antimony Pentoxide or Antimony Trioxide

| Components | Example E Weight % | Example F Weight % |
|---|---|---|
| TPO (diphenyl(2,4,6-trimethylbenzoyl) phosphine oxide) | 0.8 | 0.8 |
| MX 153 | 26 | 27.5 |
| TBBPA (tetrabromobisphenol A) | 16.5 | 16.5 |
| 3,3' DDS (3,3' diaminodiphenyl sulfone) | 3.2 | 3.5 |
| Carbon Black | 0.19 | 0.19 |
| CN 2601 | 0 | 0 |
| Nyacol APE 1540 | 5 | 0 |
| Lanxess Antimony | 0 | 2 |
|  | 100.69 | 99.99 |
| Amount of Antimony % | 2 | 2 |
| Bromine % | 9.6954 | 9.696 |
| Viscosity, @25 C. in cps | 1525 | — |
| Dc | 16.241 | 8.076 |
| Alpha | 0.00608 | 0.0104 |
| Particle Stability- Centrifuge- 6000 rpm, 20 min, 9 acc | No settling | Complete settling |

Example G: Using Antimony Pentoxide Functionalized with Ethoxylated Amine

In Examples E and F above, it was demonstrated that antimony pentoxide performs better as compared to antimony trioxide in terms of particle stability and less scattering (lower alpha). In this experiment, two different grades of antimony pentoxide were compared: Nyacol APE 1540: 40% Antimony pentoxide dispersed in a polyester resin (colloidal dispersion); and BurnEx® ADP494: 74% Antimony pentoxide functionalized with ethoxylated amine (powder). Both of the Part B components of the respective formulations have the same antimony Pentoxide content at 1.6%.

Part A:

| Components | In % |
|---|---|
| MX 153 | 27 |
| F-2200HM | 7 |
| DMAA | 8 |
| TPO | 0.8 |
| Black | 0.075 |
| F-2016 | 7 |
| CN 2601 | 0 |
| Total | 49.875 |

Two Different Part Bs:

| Components | Part B-1 (in %) | Part B-2 (in %) |
|---|---|---|
| 33 DDS | 3.3 | 3.3 |
| 44 DDS | 3.3 | 3.3 |
| DMAA | 15 | 15 |
| Genomer 4205 | 15 | 16.8 |
| CN 2601 | 5 | 5 |
| Nyacol APE 1540 | 4 | — |
| BurnEx ADP 494 | — | 2.2 |
| TBBPA | 5 | 5 |
|  | 50.6 | 50.6 |

Upon mixing Part B (i.e., Part B-1 or Part B-2) with Part A in a 1:1 ratio (by wt %) and measuring the Dc and Alpha as per CLIP process, the resin with B-2 had a lower alpha (less scattering), which aids in faster printing.

|  | Part B-1 | Part B-2 |
|---|---|---|
| Dc | 12.117 | 12.508 |
| Alpha | 0.00403 | 0.00360 |

Figure 2:
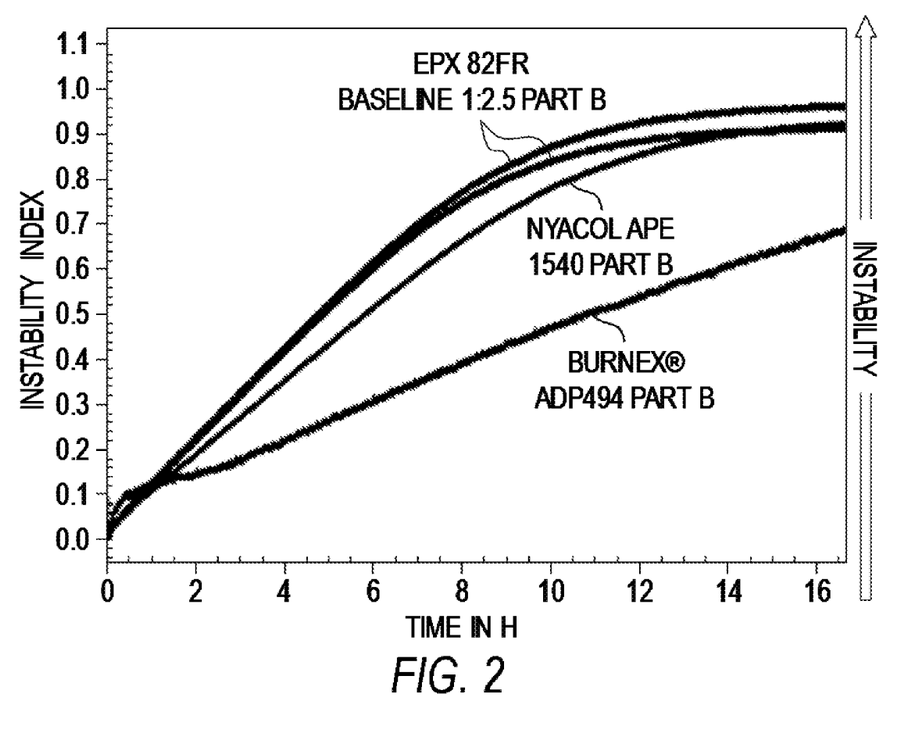
FIG. 2 presents a graph of instability index for four different resin formulations. As shown in the data, the BurnEx® ADP Part B-2 formulation is more stable as compared to the Nyacol APE 1540 Part B-1 formulation. This lower instability index promotes a longer shelf life of the product.

Particle Stability: Formulations were tested on Lumifuge with 865 nm, profiles—1000, Interval—60 s, Speed—4000 rpm, Light Factor—1.0, Temp—25 C. As reflected in the data presented in FIG. 2, BurnEx® ADP494 Part B-2 is more stable as compared to the Nyacol APE 1540 Part B-1. This lower instability index promotes a longer shelf life of the product.

The foregoing is illustrative of the present invention, and is not to be construed as limiting thereof. The invention is defined by the following claims, with equivalents of the claims to be included therein.

What is claimed is:

1. A method of forming a three-dimensional object, comprising:
    (a) providing a polymerizable liquid comprising a mixture of (i) a light polymerizable first component, (ii) a second solidifiable component that is different from said first component, wherein said second solidifiable component comprises a flame retardant group, said flame retardant group comprising a halogen group, and (iii) a flame retardant synergist, said flame retardant synergist comprising antimony pentoxide, wherein said antimony pentoxide is functionalized with ethoxylated amine;
    (b) producing a three-dimensional intermediate from said polymerizable liquid by stereolithography including irradiating said polymerizable liquid with light to form a solid polymer scaffold from said first component and containing said second solidifiable component carried in said scaffold, said intermediate having the same shape as, or a shape to be imparted to, said three-dimensional object;
    optionally wherein said polymerizable liquid further comprises an organic diluent and where said irradiating is performed under conditions in which said organic diluent chemically reacts by an amount sufficient to increase the strength of said intermediate;
    (c) optionally washing said intermediate, and
    (d) concurrently with or subsequent to said producing step (b), further curing said second solidifiable component in said three-dimensional intermediate to form said three-dimensional object.

2. The method of claim 1, wherein said polymerizable liquid further comprises a toughener.

3. The method of claim 1, wherein said producing step (b) is carried out by bottom-up stereolithography.

4. The method of claim 1, wherein said producing step (b) is carried out by: (i) providing a carrier and an optically transparent member having a build surface, said carrier and said build surface defining a build region therebetween; (ii) filling said build region with said polymerizable liquid, and (iii) irradiating said build region with light through said optically transparent member to form said solid polymer scaffold from said first component and also advancing said carrier and said build surface away from one another to form said three-dimensional intermediate.

5. The method of claim 1, wherein said further curing step (d) is carried out subsequent to said producing step (b).

6. The method of claim 1, wherein said further curing step (d) is carried out by heating, microwave irradiating, or both heating and microwave irradiating.

7. The method of claim 1, wherein said polymerizable liquid further comprises a hardener.

8. The method of claim 1, wherein said second solidifiable component comprises an epoxy or cyanate ester resin.

9. The method of claim 1, wherein said second solidifiable component comprises an epoxy.

10. The method of claim 1, wherein said organic diluent is present and comprises N,N'-dimethylacrylamide, n-vinyl-2-pyrrolidone, n-vinyl formamide, n-vinyl caprolactam, acryloylmorpholine, or a combination of two or more thereof.

11. The method of claim 7, wherein said organic diluent is included in an amount sufficient to dissolve said hardener in said polymerizable liquid.

12. The method of claim 1, wherein said polymerizable liquid further comprises a chain extender.

13. The method of claim 1, wherein said three-dimensional object is rigid.

14. The method of claim 1, wherein the halogen group is bromine in an amount of from 1 to 20% by weight of the polymerizable liquid.

15. The method of claim 1, wherein the flame retardant synergist is present in an amount of from 0.1 to 5% by weight of the polymerizable liquid.

16. The method of claim 1, wherein the organic diluent is present.

17. The method of claim 1, wherein the organic diluent is present and wherein the irradiating is performed under conditions in which the organic diluent chemically reacts with a light polymerizable component, by degradation, isomerization, cross reaction, and/or polymerization, by an amount sufficient to increase the strength of the intermediate.

18. The method of claim 2, wherein the toughener is a core shell rubber, a thermoplastic toughener, or a combination thereof, present in an amount of from about 5 to 30 percent by weight of the polymerizable liquid.

19. The method of claim 2, wherein the toughener has a phenol, amine, epoxide, or isocyanate reactive end group that is reactive with epoxides.

20. The method of claim 1, wherein said producing step (b) is carried out by continuous liquid interface production.

21. The method of claim 7, wherein the hardener is present in an amount of at least 1 percent by weight up to 50 percent by weight of the polymerizable liquid.

22. The method of claim 7, wherein the hardener comprises a compound having amine, thiol, vinyl ether, maleimide, or allyl reactive end groups.

23. The method of claim 7, wherein the hardener is present in an amount of at least 5 percent by weight up to 40 percent by weight of the polymerizable liquid.

24. The method of claim 1, wherein said second solidifiable component comprises an epoxy or cyanate ester resin in an amount from 20 to 70 percent by weight of the polymerizable liquid.

25. The method of claim 9, wherein the epoxy is a brominated epoxy.

26. The method of claim 1, wherein said second solidifiable component comprises an epoxy in combination with a cyanate ester resin.

27. The method of claim 12, wherein the chain extender is a dihydric phenolic compound.

28. The method of claim 12, wherein the chain extender is present in an amount of from 5 to 30 percent by weight of the polymerizable liquid.

29. The method of claim 12, wherein the light polymerizable liquid further comprises a chain extender catalyst.

30. The method of claim 29, wherein the chain extender catalyst is an onium salt.

31. The method of claim 30, wherein the onium salt is a phosphonium salt.

32. The method of claim 29, wherein the chain extender catalyst is present in an amount of from 0.01 to 10 percent by weight of the polymerizable liquid.

* * * * *

UNITED STATES PATENT AND TRADEMARK OFFICE
CERTIFICATE OF CORRECTION

PATENT NO. : 11,407,890 B2
APPLICATION NO. : 17/271360
DATED : August 9, 2022
INVENTOR(S) : Grover et al.

It is certified that error appears in the above-identified patent and that said Letters Patent is hereby corrected as shown below:

On the Title Page

OTHER PUBLICATIONS, Column 2, Line 51: Please correct "SIEMMELEN" to read --STEMMELEN--

In the Specification

Column 8, Line 29: Please correct "3,947,3951" to read --3,947,395;--

Signed and Sealed this
Third Day of January, 2023

Katherine Kelly Vidal
*Director of the United States Patent and Trademark Office*